United States Patent
Jost (10) Patent No.: US 9,816,838 B2
(45) Date of Patent: Nov. 14, 2017

(54) MAGNETORESISTIVE ANGLE SENSOR WITH LINEAR SENSOR ELEMENTS

(71) Applicant: Infineon Technologies AG, Neubiberg (DE)

(72) Inventor: Franz Jost, Stuttgart (DE)

(73) Assignee: Infineon Technologies AG, Neubiberg (DE)

(*) Notice: Subject to any disclaimer, the term of this patent is extended or adjusted under 35 U.S.C. 154(b) by 178 days.

(21) Appl. No.: 14/833,707

(22) Filed: Aug. 24, 2015

(65) Prior Publication Data

US 2017/0059363 A1 Mar. 2, 2017

(51) Int. Cl.
*G01B 7/14* (2006.01)
*G01D 5/20* (2006.01)
*G01R 33/09* (2006.01)

(52) U.S. Cl.
CPC ............... *G01D 5/20* (2013.01); *G01R 33/09* (2013.01); *G01R 33/093* (2013.01); *G01R 33/098* (2013.01)

(58) Field of Classification Search
CPC .................. G01D 5/20; G01R 33/0206; G01R 33/06–33/098; G01R 33/0005; G01R 33/0052
See application file for complete search history.

(56) References Cited

U.S. PATENT DOCUMENTS

| 6,075,437 | A | 6/2000 | Heremans et al. |
| 6,304,074 | B1 | 10/2001 | Waffenschmidt |
| 6,326,781 | B1 | 12/2001 | Kunde et al. |
| 6,534,969 | B1 | 3/2003 | Dietmayer |
| 6,633,462 | B2 | 10/2003 | Adelerhof |
| 7,635,974 | B2 | 12/2009 | Guo et al. |
| 7,697,243 | B1 | 4/2010 | Novosad et al. |

(Continued)

FOREIGN PATENT DOCUMENTS

| CN | 102830374 A | 12/2012 |
| EP | 2264476 B1 | 6/2009 |

(Continued)

OTHER PUBLICATIONS

Stork, "Electronic Compass Design using KMZ51 and KMZ52", Application Note AN00022, Philips Semiconductors, Mar. 2000, 38 pages.

*Primary Examiner* — Daniel Miller
(74) *Attorney, Agent, or Firm* — Harrity & Harrity, LLP (57) ABSTRACT

A magnetic sensor may comprise a first linear output sensing element configured to sense a first component of an external magnetic field associated with a first axis. The first linear output sensing element may provide a first output voltage corresponding to the first component of the external magnetic field. The magnetic sensor may also comprise a second linear output sending component configured to sense a second component of the external magnetic field associated with a second axis. The second axis may be substantially orthogonal to the first axis. The second linear output sensing element may provide a second output voltage corresponding to the second component of the external magnetic field. The first output voltage and the second output voltage may be provided to determine an angle, associated with the external magnetic field, corresponding to a plane including the first axis and the second axis.

20 Claims, 8 Drawing Sheets

(56) References Cited

U.S. PATENT DOCUMENTS

| | | |
|---|---|---|
| 8,471,552 B2 | 6/2013 | Suzuki |
| 8,552,720 B2 | 10/2013 | Kou et al. |
| 8,729,890 B2 | 5/2014 | Donovan et al. |
| 2006/0113112 A1* | 6/2006 | Waters ............... E21B 7/04 175/61 |
| 2010/0072988 A1* | 3/2010 | Hammerschmidt .... H03M 1/28 324/207.25 |
| 2010/0118447 A1* | 5/2010 | Hammerschmidt .... H01L 41/47 360/315 |
| 2011/0074406 A1* | 3/2011 | Mather .............. B82Y 25/00 324/252 |
| 2011/0187361 A1* | 8/2011 | Vanhelmont ........ B82Y 25/00 324/252 |
| 2011/0227569 A1* | 9/2011 | Cai .................. B82Y 25/00 324/252 |
| 2013/0300409 A1 | 11/2013 | Deak et al. |

FOREIGN PATENT DOCUMENTS

| | | |
|---|---|---|
| EP | 2360455 B1 | 2/2010 |
| EP | 233492 A1 | 11/2010 |
| EP | 2455720 A1 | 9/2011 |

* cited by examiner

FIG. 6B ial field. Accordingly, a linear sensing element may be capable of sensing any intensity of the external magnetic field.

MAGNETORESISTIVE ANGLE SENSOR WITH LINEAR SENSOR ELEMENTS

BACKGROUND

A magnetic angle sensor may be used to determine an absolute orientation of a magnetic field (e.g., between zero degrees and three hundred and sixty degrees). A magnetic angle sensor may use giant magnetoresistance (GMR) technology, anisotropic magnetoresistance (AMR) technology, tunnel magnetoresistance (TMR) technology, or the like.

SUMMARY

According to some possible implementations, a magnetic sensor may comprise: a first linear output sensing element configured to: sense a first component of an external magnetic field, where the first component of the external magnetic field may be associated with a first axis, and provide a first output voltage corresponding to the first component of the external magnetic field; and a second linear output sensing element configured to: sense a second component of the external magnetic field, where the second component of the external magnetic field may be associated with a second axis, where the second axis may be substantially orthogonal to the first axis, and provide a second output voltage corresponding to the second component of the external magnetic field, where the first output voltage and the second output voltage may be provided to determine an angle associated with the external magnetic field, the angle corresponding to a plane including the first axis and the second axis.

According to some possible implementations, a method, may comprise: sensing, by a first linear output element, a first component of a magnetic field, where the first component of the magnetic field may be associated with a first direction; outputting, by the first linear output element, a first voltage corresponding to the first component of the magnetic field; sensing, by a second linear output element, a second component of the magnetic field, where the second component of the magnetic field may be associated with a second direction, where the second direction may be approximately ninety degrees with respect to the first direction; and outputting, by the second linear output element, a second voltage corresponding to the second component of the magnetic field, where the first voltage and the second voltage may be provided to calculate a first angle associated with the magnetic field, where the first angle may be associated with a plane associated with the first direction and the second direction.

According to some possible implementations, an apparatus may comprise: a first linear sensing element configured to: sense a first component of an external magnetic field, where the first component of the external magnetic field may correspond to a first axis, and provide a first voltage corresponding to the first component of the external magnetic field; a second linear sensing element configured to: sense a second component of the external magnetic field, where the second component of the external magnetic field may correspond to a second axis, where the second axis may be approximately orthogonal to the first axis, and provide a second voltage corresponding to the second component of the external magnetic field; and a third linear sensing element configured to: sense a third component of the external magnetic field, where the third component of the external magnetic field may correspond to a third axis, where the third axis may be approximately orthogonal to both the first axis and the second axis, and provide a third voltage corresponding to the third component of the external magnetic field, where the first voltage, the second voltage, and the third voltage may be provided to determine at least two angles or a position associated with the external magnetic field.

DETAILED DESCRIPTION

The following detailed description of example implementations refers to the accompanying drawings. The same reference numbers in different drawings may identify the same or similar elements.

A magnetic angle sensor (herein referred to as an angle sensor) may be configured to use a magnetoresistive effect (e.g., AMR, GMR, TMR, etc.) to sense an angle (e.g., a direction) of an external magnetic field generated by a magnet. Such an angle measurement may be useful in a wide variety of applications, such as an automotive application, an industrial application, a mechanical application, or the like. One or more sinusoidal sensing elements of the magnetic angle sensor may be configured to provide, as outputs, voltage signals that are sinusoidally proportional to the angle of the external magnetic field. Here, the angle of the external magnetic field may be derived based on the sinusoidal relationship between the voltage signals and the sensed external magnetic field.

However, it may be desirable to include one or more linear sensing elements in the magnetic angle sensor (e.g., rather than the sinusoidal sensing elements). For example, a linear sensing element (e.g., using TMR technology) may be capable of sensing a broader range of magnetic field intensities than a sinusoidal sensing element such that any magnetic field may be measured (e.g., a low intensity natural magnetic field, a low intensity generated magnetic field, a high intensity natural magnetic field, a high intensity generated magnetic field, etc.).

In some implementations, a linear sensing element may include a sensing element sensitive to a single component of the external magnetic field (e.g., an X-component, a Y-component, a Z-component, etc.). The linear sensing element may be capable of providing an output voltage that is linearly proportional to the component of the external magnetic field to which the liner sensing element is sensitive. For example, a linear sensing element sensitive in an X-direction may sense only an X-component of the external magnetic field and may output a corresponding first voltage. As another example, a linear sensing element sensitive is a Y-direction may sense only a Y-component of the external magnetic field and may output a corresponding second voltage. As an additional example, a linear sensing element sensitive in a Z-direction may sense only a Z-component of the external magnetic field and may output a corresponding third voltage.

Implementations described herein may allow one or more angles, associated with a magnetic field applied to a magnetic angle sensor, to be determined based on two or more output voltages provided by a set of linear sensing elements of the angle sensor. In some implementations, using the set of linear sensing elements may allow a magnetic field (e.g., a natural magnetic field, a generated magnetic field, etc.) of any intensity to be sensed, such as a low intensity magnetic field or a high intensity magnetic field.

Figure 1:
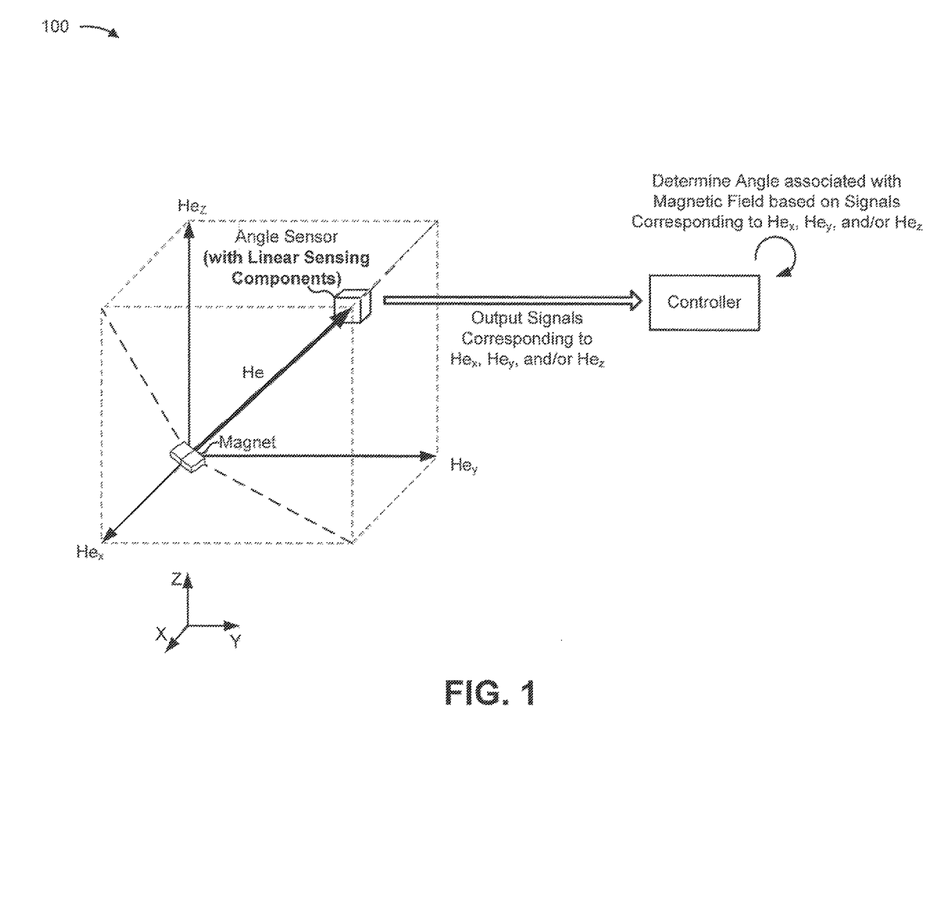
FIG. 1 is a diagram of an overview of an example implementation described herein.

FIG. 1 is a diagram of an overview of an example implementation 100 described herein. For the purposes of example implementation 100, assume that an angle sensor is positioned to detect an external magnetic field (e.g., He) generated by a magnet. Further, assume that magnet is capable of moving in and/or rotating about an X-direction, a Y-direction, and/or a Z-direction and is capable of rotating (e.g., around an axis corresponding to the X-direction, the Y-direction, and/or the Z-direction).

As shown in FIG. 1, the angle sensor may include a set of linear sensing elements. For example, the angle sensor may include a first linear sensing element configured to sense a component of the external magnetic field in the X-direction (e.g., $He_x$), a second linear sensing element configured to sense a component of the external magnetic field in the Y-direction (e.g., $He_y$), and/or a third linear sensing element configured to sense a component of the external magnetic field in the Z-direction (e.g., $He_z$). In some implementations, the angle sensor may include two linear sensing elements. In some implementations, the angle sensor may include three linear sensing elements.

As further shown in FIG. 1, the linear sensing elements of the angle sensor may provide, to a controller associated with the angle sensor, output signals corresponding to the sensed components of the external magnetic field. For example, the first linear sensing element may provide an output voltage corresponding to the $He_x$, the second linear sensing element may provide an output voltage corresponding to the $He_y$, and the third sensing element may provide an output voltage corresponding to the $He_z$. As described above, the output voltages of the linear sensing elements may be linearly related to the corresponding sensed components of the external magnetic field.

As further shown, the controller may receive the output signals provided by the linear sensing elements, and may determine a set of angles based on the output signals. In some implementations, the set of angles may be used to identify a position of the magnet in relation to the angle sensor, such as a linear position, a position on a two-dimensional plane, a position in a three-dimensional space, an angle of rotation, or the like. In this way, one or more angles, associated with a magnetic field applied to an angle sensor, may be determined based on two or more output voltages provided by a set of linear sensing elements of the angle sensor. In some implementations, using the set of linear sensing elements may allow a broad range of magnetic fields to be sensed (e.g., a low intensity natural magnetic field, a high intensity generated magnetic field).

Figure 2:
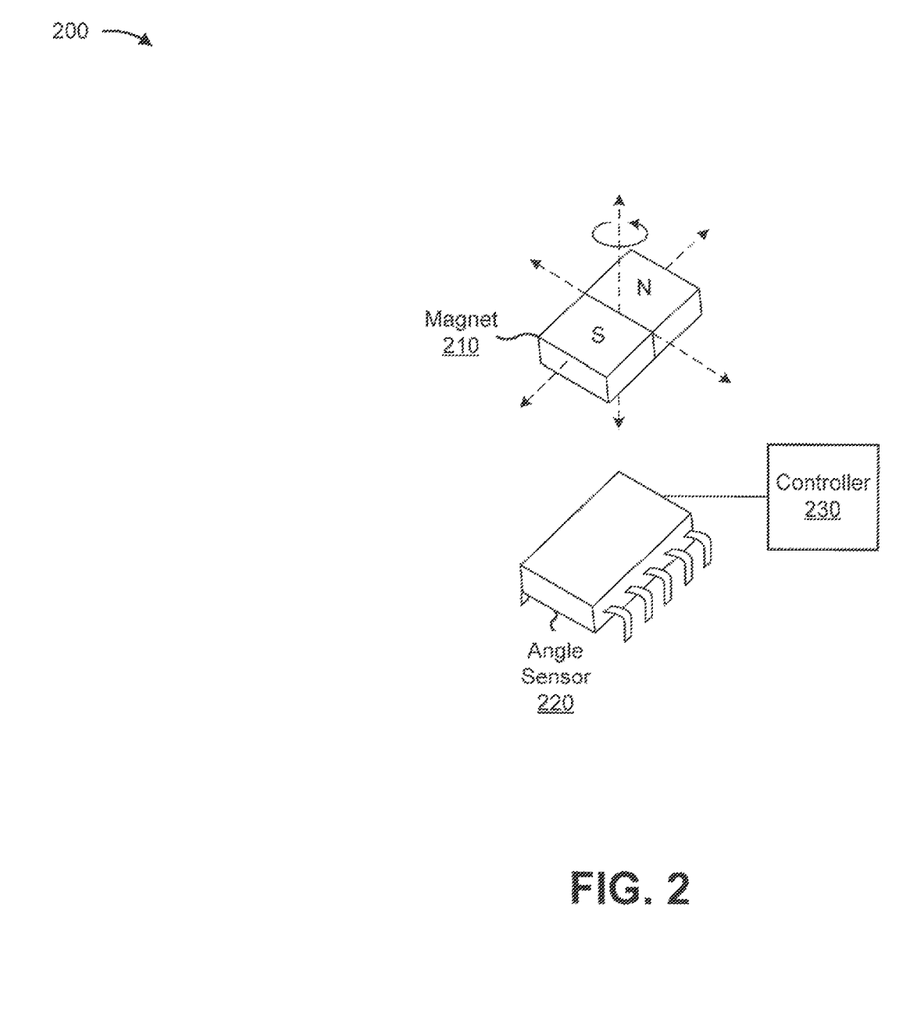
FIG. 2 is a diagram of an example environment in which systems and/or methods, described herein, may be implemented.

FIG. 2 is a diagram of an example environment 200 in which systems and/or methods, described herein, may be implemented. As shown in FIG. 2, environment 200 may include a magnet 210, an angle sensor 200, and a controller 230. Angle sensor 220 may be connected to controller 230 via a wired connection, a wireless connection, or a combination of wired and wireless connections. In some implementations, angle sensor 220 may include controller 230.

Magnet 210 may include one or more magnets. In some implementations, magnet 210 may include a magnetic pole wheel (e.g., with at least two alternating poles, such as a north pole and a south pole,), a dipole magnet (e.g., a dipole bar magnet, a circular dipole magnet, an elliptical dipole magnet, etc.), a permanent magnet, an electromagnet, a magnetic scale, a magnetic tape, or the like. For example, magnet 210 may include a dipole magnet, as shown in FIG. 2. Magnet 210 may be comprised of a ferromagnetic material, and may produce a magnetic field. Magnet 210 may further comprise a rare earth magnet which may be of advantage due to an intrinsically high magnetic field strength of rare earth magnets. In some implementations, magnet 210 may be attached to or coupled with an object for which a position (e.g., a linear position, a position on a two-dimensional plane, a position in a three dimensional space, an angle of rotation, etc.) is to be measured.

Angle sensor 220 may include one or more apparatuses for detecting intensities of components of a magnetic field based on a magnetoresistive effect. In some implementations, the intensities of the magnetic field may be used to determine a direction of the magnetic field (e.g., a magnetic field angle with respect to a reference direction). For example, angle sensor 220 may include one or more circuits (e.g., one or more integrated circuits). Additionally, or alternatively, angle sensor 220 may include a magnetic angle sensor, a magnetic position sensor, or the like. Angle sensor 220 may be positioned at a location relative to magnet 210, such that angle sensor 220 may detect an intensity of a magnetic field generated by magnet 210. In some implementations, angle sensor 220 may measure magnetoresistance based on an anisotropic magnetoresistance (AMR) effect, a giant magnetoresistance (GMR) effect, a tunnel magnetoresistance (TMR) effect, or the like.

In some implementations, angle sensor 220 may include two or more linear output sensing elements configured to detect an intensity of a component of an external magnetic field applied to angle sensor 220 by magnet 210. For example, angle sensor 220 may include a first sensor bridge configured to detect an intensity of an X-component of the external magnetic field applied by magnet 210, a second sensor bridge configured to detect an intensity of a Y-component of the external magnetic field applied by magnet 210, and/or a third sensor bridge configured to detect an intensity of a Z-component of the external magnetic field applied by magnet 210. In some implementations, each linear output sensing element may be configured to output an output signal corresponding to the detected intensity of the component of the external magnetic field, where a voltage level of the output signal may be linearly related to the intensity of the detected component the external magnetic field. In some implementations, the two or more output signals provided by the two or more linear sensing elements of angle sensor 220 may be used (e.g., by angle sensor 220 and/or controller 230) to determine a position of magnet 210 in relation to angle sensor 220, such as a linear position, a position on a two-dimensional plane, a position in a three-dimensional space, an angle of rotation (e.g., an angle greater than or equal to zero degrees and less than or equal to three hundred and sixty degrees), or the like.

In some implementations, angle sensor 220 may include an integrated circuit. In some implementations, the integrated circuit may include two sensor bridges associated with detecting two components of the external magnetic field. In some implementations, the integrated circuit may include three sensor bridges associated with detecting three components of the external magnetic field. In some implementations, the sensor bridges may be included on a single integrated circuit that is approximately less than or equal to ten micrometers per side. In some implementations, the integrated circuit may include an integrated controller 230 (e.g., such that an output of angle sensor 220 may be information that describes a position of magnet 210).

Additional details regarding angle sensor 220 are described in further detail below.

Controller 230 may include one or more apparatuses for associated with determining a position of magnet 210 relative to angle sensor 220, and providing information associated with the position of magnet 210 (e.g., for use in controlling a system, for use in identifying the position of magnet 210, etc.). For example, controller 230 may include one or more circuits (e.g., an integrated circuit, a control circuit, a feedback circuit, etc.). Controller 230 may receive input from one or more sensors, such as one or more angle sensors 220, may process the input (e.g., using an analog signal processor, a digital signal process, etc.), and may provide output based on the input. For example, controller 230 may receive one or more input signals from angle sensor 220, and may use the one or more input signals to generate an output signal.

The number and arrangement of devices and components shown in FIG. 2 are provided as an example. In practice, there may be additional devices and/or components, fewer devices and/or components, different devices and/or components, or differently arranged devices and/or components than those shown in FIG. 2. Furthermore, two or more devices and/or components shown in FIG. 2 may be implemented within a single device and/or a single component, or a single device and/or a single component show in FIG. 2 may be implemented as multiple, distributed devices and/or components. Additionally, or alternatively, a set of devices (e.g., one or more devices) and/or a set of components (e.g., one or more components) of environment 200 may perform one or more functions described as being performed by another set of devices and/or another set of components of environment 200.

Figure 3:
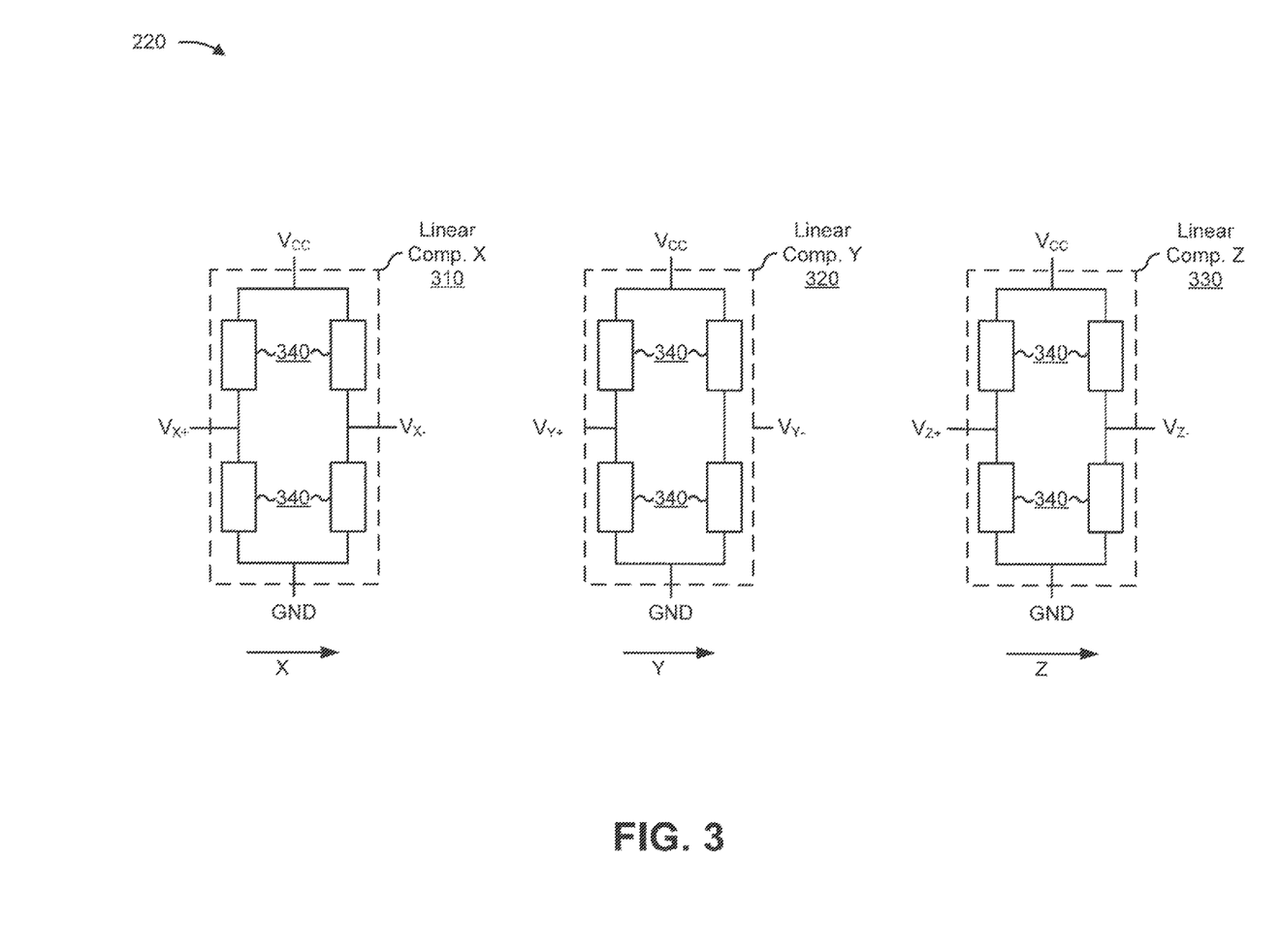
FIG. 3 is a diagram of example components of a magnetic angle sensor of FIG. 2.

FIG. 3 is a diagram of example elements of angle sensor 220 of FIG. 2. As shown in FIG. 3, in some implementations, angle sensor 220 may include a linear sensing element 310 associated with first sensitivity direction (herein referred to as a linear element X 310), a linear sensing element 320 associated with a second sensitivity direction (herein referred to as linear element Y 320), and/or a linear sensing element 330 associated with a third sensitivity direction (herein referred to as linear element Z 330). In some implementations, the first sensitivity direction, the second sensitivity direction, and the third sensitivity direction may be orthogonal (e.g., at 90 degrees, at substantially 90 degrees, such as ±1 degree, ±5 degrees, etc.) with respect to each other. For example, in some implementations, the first sensitivity direction may correspond to an X-direction, the second sensitivity direction may correspond to a Y-direction, and the third sensitivity direction may correspond to a Z-direction.

Linear element X 310 may include an element configured to provide an output signal based on an intensity of a first component of an external magnetic field applied to angle sensor 220, such as an X-component of the external magnetic field. For example, as shown, linear element X 310 may include a bridge (e.g., a Wheatstone bridge, etc.) that includes a set of four resistors 340. Each resistor 340 may include, for example, a magnetoresistive element (e.g., a magnet-resistor) with an electrical resistance that depends on an intensity of a component of an external magnet field applied to resistor 340.

In some implementations, linear element X 310 may be sensitive to the X-component of the external magnetic field only. In other words, linear element X 310 and /or resistors 340 of linear element X 310 may be configured such that the output voltage (e.g., $V_x$) provided by linear element X 310 varies based on changes to only the X-component of the external magnetic field. In some implementations, linear element X 310 may generate (e.g., as the output voltage of linear element X 310) a linear output corresponding to the X-component of the external magnetic field. In other words, the output of linear element X 310 may be linearly related to the X-component of the external magnetic field.

Linear element Y 320 may include an element configured to provide an output signal based on an intensity of a second component of the external magnetic field applied to angle sensor 220, such as a Y-component of the external magnetic field, a component orthogonal to the first component of the first magnetic field, or the like. For example, as shown, linear element Y 320 may include a bridge (e.g., a Wheatstone bridge) that includes a set of four resistors 340. In some implementations, linear element Y 320 may be sensitive to the Y-component of the external magnetic field only. In other words, linear element Y 320 and/or resistors 340 of linear element Y 320 may be configured such that the output voltage (e.g., $V_y$), provided by linear element Y 320 varies based on changes to only the Y-component of the external magnetic field. In some implementations, linear element Y 320 may generate (e.g., as the output voltage of linear element Y 320) a linear output corresponding to the Y-component of the external magnetic field. In other words, the output of linear element Y 320 may be linearly related to the Y-component of the external magnetic field.

Linear element Z 330 may include an element configured to provide an output signal based on an intensity of a third component of the external magnetic field applied to angle sensor 220, such as a Z-component, a component orthogonal to the first component of the external magnetic field and orthogonal to the second component of the external magnetic field, or the like. For example, as shown, linear element Z 330 may include a bridge (e.g., a Wheatstone bridge) that includes a set of four resistors 340. In some implementations, linear element X 330 may be sensitive to the Z-component of the external magnetic field only. In other words, linear element Z 330 and/or resistors 340 of linear element Z 330 may be configured such that the output voltage (e.g., $V_z$) provided by linear element Z 330 varies based on changes to only the Z-component of the external magnetic field. In some implementations, linear element Z 330 may generate (e.g., as the output voltage of linear element Z 330) a linear output corresponding to the Z-component of the external magnetic field. In other words, the output of linear element Z 330 may be linearly related to the Z-component of the external magnetic field.

As shown, linear element X 310, linear element Y 320, and linear element Z 330 may be coupled to a power supply, and may receive an input voltage signal (shown as $V_{cc}$). As further shown, linear element X 310, linear element Y 320, and linear element Z 330 may receive the input voltage signal $V_{cc}$ in relation to a reference voltage signal (e.g., a ground voltage signal, shown as GND). In some implementations, linear element X 310, linear element Y 320, and/or linear element Z 330 may be coupled to a single power supply or different power supplies. Additionally, or alternatively, linear element X 310, linear element Y 320, and linear element Z 330 may receive the respective input voltages signals in relation to a single reference voltage signal or different reference voltage signals.

As described above, in some implementations, outputs of linear element X 310, linear element Y 320, and linear sensing element Z 330 may be linearly related to the X-component of the external magnetic field, the Y-component of the external magnetic field, and the Z-component of the external magnetic field, respectively.

In some implementations, an output associated with a first linear sensing element may be used as a supply voltage to another linear sensing element in order to increase sensitivity associated with determining the position of magnet 210. For example, an output voltage of linear element X 310 may be used as a supply voltage for linear element Y 320 to increase the sensitivity by a factor of two. Here, an output voltage of linear element X 310 may linearly depend on a supply voltage to linear element X 310. As such, if the output voltage of linear element X 310 is used as a supply voltage of linear element Y 320, since the output voltage of linear element Y 320 may linearly depend on the supply voltage of linear element Y 320 (i.e., the output voltage of linear element X 310), the sensitivity of angle sensor 220 may increase by a factor of two (e.g., the amount of change in the angle that may detected by angle sensor 220 may double). This procedure may also be extended to linear element Z 330 and/or additional sensing elements (use of a microcontroller may be needed in such a case).

Figure 4:
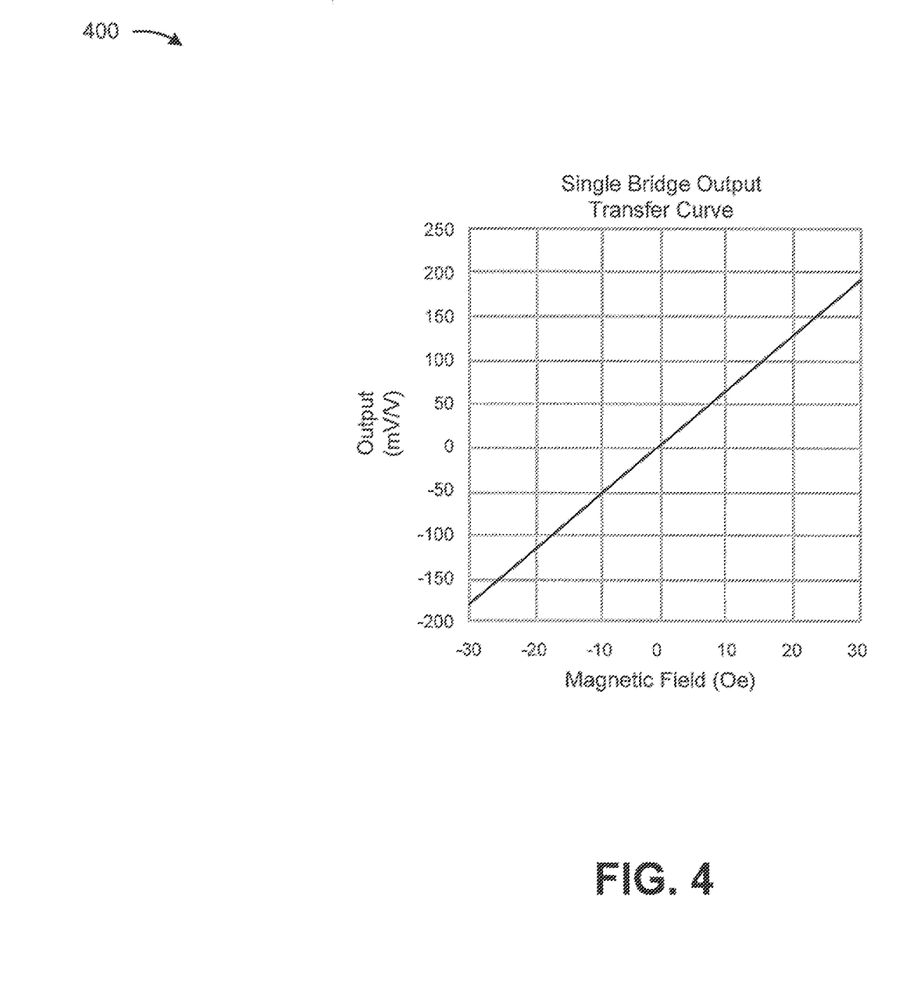
FIG. 4 is a diagram of an example transfer curve associated with a linear sensing element of the magnetic angle sensor of FIG. 2.

FIG. 4 is a diagram of an example transfer curve associated with a linear sensing element 400 of angle sensor 220. In some implementations, linear sensing element 400 may correspond to linear element X 310, linear element Y 320, and/or linear element Z 330. As shown in FIG. 4, and as described above, a range of possible output voltages, which may be provided by linear sensing element 400, may be linearly related to a range of magnetic field intensity that may be detected by linear sensing element 400. For example, as shown, output voltages provided by linear sensing element 400 may range from approximately −180 millivolts/Volt (mV/V) to approximately 180 mV/V for magnetic field intensities in a range of approximately −30 Oersted (Oe) to approximately 30 Oe. As such, in some implementations, linear sensing element 400 may have a broad linear range such that linear sensing element 400 may be capable of sensing a wide range of magnetic field intensities.

As shown by FIG. 4, in some implementations, the component of the external magnetic field intensity may be a positive magnetic field intensity, a negative magnetic field intensity, or a zero magnetic field intensity. As such, the corresponding output voltage provided by linear sensing element 400 may also be a positive voltage, a negative voltage, or a zero voltage. In some implementations, the output voltage of linear sensing element 400 may be affected by an offset voltage (e.g., an offset that arises due to a tolerance and/or a temperature drift associated with resistors 340).

In some implementations, the linear relationship between the output voltage range and the magnetic field intensity range may be different than that shown in FIG. 4. For example, the output voltage range may be larger or smaller, the magnetic field intensity range may be larger or smaller, the slope of the linear relationship may be greater, lower, negative, positive, or the like. In some implementations, linear sensing element 400 may sense the component of the external magnetic field intensity based on a TMR effect. In such implementations, the output voltage provided by linear sensing element 400 may be processed without averaging, amplification, or other adjustments of the output voltage (e.g., the voltage signal may be provided directly from an analog-to-digital converter, associated with angle sensor 220, for processing the controller 230 without amplification).

Moreover, use of TMR linear sensing elements 400 may reduce a cost associated with manufacturing, installing, and/or operating angle sensor 220, such as a monetary cost, a cost in terms of a size of angle sensor 220, a cost in terms of powering angle sensor 220, or the like. Additionally, or alternatively, linear sensing element 400 may sense the component of the external magnetic field based on another type of magnetoresistive effect, such as AMR or GMR.

In some implementations, angle sensor 220 may include three linear sensing elements 400 (e.g., linear element X 310, linear element Y 320, and linear element Z 330). For example, in some implementations, angle sensor 220 may include linear element X 310, linear element Y 320, and linear element Z 330 on a single integrated circuit with a length of approximately ten micrometers per side of the integrated circuit. In some implementations, angle sensor 220 may include linear element X 310, linear element Y 320, linear element Z 330 on a single integrated circuit with a length of less than ten micrometers per side.

Figure 5:
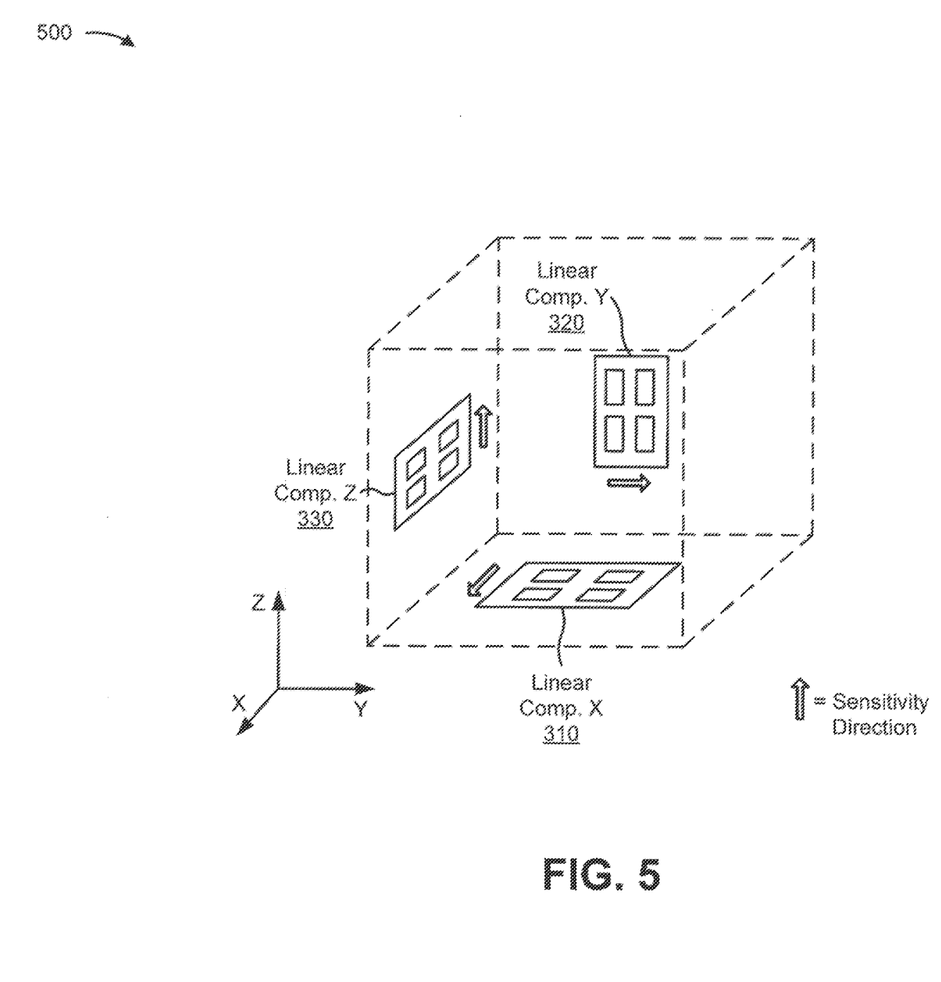
FIG. 5 is a diagram of an example arrangement of a linear sensing element of the magnetic angle sensor of FIG. 2.

FIG. 5 is a diagram of an example arrangement 500 of linear element X 310, linear element Y 320, and linear element Z 330 of angle sensor 220. As shown in FIG. 5, each linear sensing element may be positioned such that a sensitivity direction of the linear sensing element lies on a plane corresponding to the sensitivity direction. For example, linear element X 310 may lie on an X-Y plane and may be positioned such that the sensitivity direction of linear element X 310 lies in the X direction. As another example, linear element Y 320 may lie on a Y-Z plane and may be positioned such that the sensitivity direction of linear element Y 320 lies in the Y direction. As an additional example, linear element Z 330 may lie in a X-Z plane and may be positioned such that the sensitivity direction of linear element Z 330 lies in the Z direction.

In some implementations, as shown in FIG. 5, linear element X 310, linear element Y 320, and/or linear element Z 330 may be geometrically separated. Additionally, or alternatively, linear element X 310, linear element Y 320, and/or linear element Z 330 may be positioned to measure the respective components of the external magnetic field at a single point (e.g., angle sensor 220 may be a three-dimensional sensor).

In some implementations, angle sensor 220 may include only two linear sensing elements (e.g., angle sensor 220 may be a two-dimensional sensor). For example, angle sensor 220 may include only linear element X 310 and linear element Y 320, only linear element X 310 and linear element Z 330, or only linear element Y 320 and linear element Z 330. In some implementations, linear sensing elements of angle sensor 220 may be located on a single integrated circuit or multiple integrated circuits.

In some implementations, the output signals (e.g., voltages) provided by linear element X 310, linear element Y 320, and/or linear element Z 330 may be used (e.g., by angle sensor and/or controller 230) to determine a set of angles corresponding to the external magnetic field, as described in further detail below.

The number of elements, arrangements of elements, and capabilities of elements shown in FIGS. 3, 4, and 5 are provided merely as examples. In practice, angle sensor 220 may include additional elements, fewer elements, different elements, differently arranged elements, or elements with difference capabilities than those shown in FIGS. 3, 4, and 5. Additionally, or alternatively, a set of elements (e.g., one or more elements) of angle sensor 220 may perform one or more functions described as being performed by another set of elements of angle sensor 220.

Figure 6A:
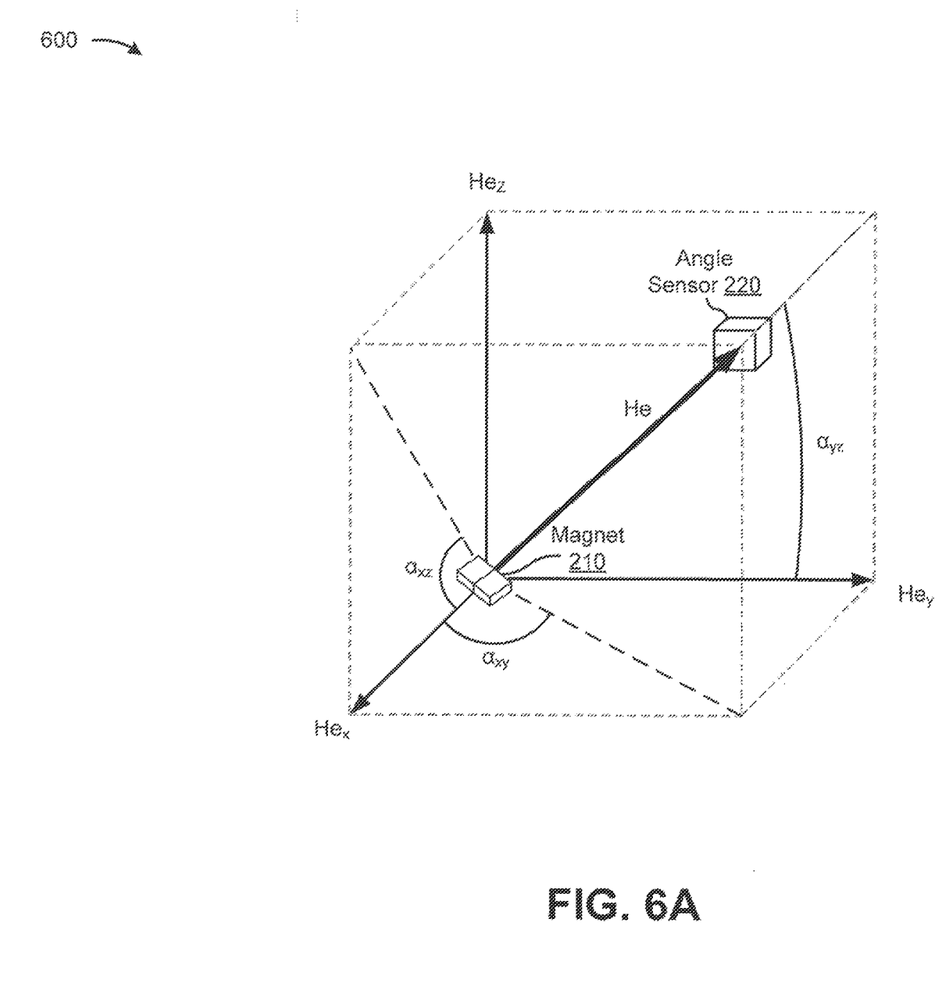
FIG. 6A and 6B are diagrams of an example implementation associated with determining one or more angles based on two or more output voltages provided by linear sensing elements of the magnetic angle sensor of FIG. 2.
Figure 6B:
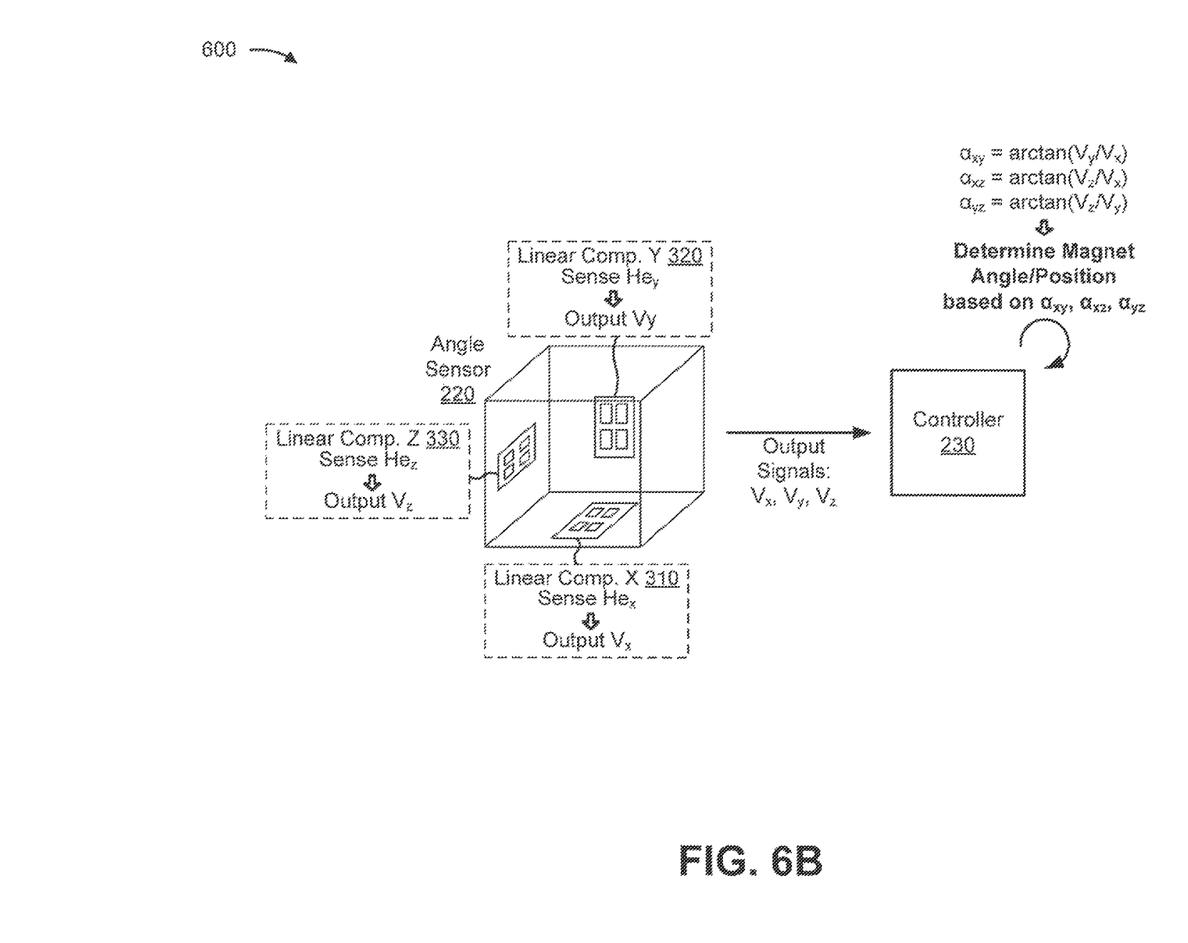

FIGS. 6A and 6B are diagrams of an example implementation 600 associated with determining one or more angles based on two or more output voltages provided by linear sensing elements 400 of angle sensor 220. For the purposes of example implementation 600, assume that angle sensor 220 is positioned to sense an external magnetic field applied by magnet 210. Further, assume that magnet 210 is capable of moving in and/or rotating about an X-direction, a Y-direction, and/or a Z-direction and is capable of rotating around an axis (e.g., an axis corresponding to the X-direction, an axis corresponding to the Y-direction, an axis corresponding to the Z-direction, etc.).

As shown in FIG. 6A, a first angle (e.g., $\alpha_{xy}$) describes a direction of an external magnetic field (e.g., He) with respect to a first plane (e.g., an X-Y plane), a second angle (e.g., $\alpha_{xz}$) describes a direction of the external magnetic field with respect to a second plane (e.g., an X-Z plane), and a third angle (e.g., $\alpha_{yz}$) describes a direction of the external magnetic field with respect to a third plane (e.g., a Y-Z plane). Here $\alpha_{xy}$, $\alpha_{xz}$, and/or $\alpha_{yz}$ may be used to identify position of magnet 210 in relation to angle sensor 220. As such, it may be desirable to determine $\alpha_{xy}$, $\alpha_{xz}$, or $\alpha_{yz}$.

In some implementations, $\alpha_{xy}$, $\alpha_{xz}$, and/or $\alpha_{yz}$ may be determined based on components of the external magnetic field applied to angle sensor 220. For example, the external magnetic field applied to angle sensor 220 may be described as a set of three components, including an X-component (e.g., $He_x$), a Y-component (e.g., $He_y$), and a Z-component (e.g., $He_z$). Here $\alpha_{xy}$, $\alpha_{xz}$, and/or $\alpha_{yz}$ may be determined based on the components of the external magnetic field. For example as shown by FIG. 6A, $\alpha_{xy}$, $\alpha_{xz}$, and $\alpha_{yz}$ may be determined based on the following equations:

$$\alpha_{xy} = \arctan(He_y/He_x) \quad (1)$$

$$\alpha_{xz} = \arctan(He_z/He_x) \quad (2)$$

$$\alpha_{yz} = \arctan(He_z/He_y) \quad (3)$$

As such, measurements identifying $He_x$, $He_y$, and/or $He_z$ may allow $\alpha_{xy}$, $\alpha_{xz}$, and/or $\alpha_{yz}$ to be determined. In some implementations, as described above, $He_x$, $He_y$, and $He_z$ may be linearly related to output voltages $V_x$, $V_y$, and $V_z$ provided by linear element X 310, linear element Y 320 and linear element Z 330, respectively. Therefore $\alpha_{xy}$, $\alpha_{xz}$, and/or $\alpha_{yz}$ may be determined based on $V_x$, $V_y$, and $V_z$. For example $\alpha_{xy}$ may be determined based on the following equation:

$$\alpha_{xy} = \arctan(V_y/V_x) = \arctan\frac{(He \times (S+S_{xy}) \times \sin(\alpha_{xy} + \beta_{xy}) + V_{oy})}{(He \times S \times \cos(\alpha_{xy}) + V_{ox})} \quad (4)$$

where S is a known sensitivity parameter associated with linear element X 310, linear element Y 320, and linear element Z 330, $S_{xy}$ is a sensitivity difference between linear element X 310 and linear element Y 320, $\beta_{xy}$ is a non-orthogonality parameter associated with linear element X 310 and linear element Y 320 (e.g., a parameter that represents a real angular displacement between linear element X 310 and linear element Y 320, since an angle between linear element X 310 and linear element Y 320 may deviate from ninety degrees, for example, due to a mounting tolerance), $V_{oy}$ is an offset voltage associated with linear element Y 320, and $V_{ox}$ is an offset voltage associated with linear element X 310.

As another example, $\alpha_{xz}$ may be determined based on the following equation:

$$\alpha_{xz} = \arctan(V_z/V_x) = \arctan\frac{(He \times (S+S_{xz}) \times \sin(\alpha_{xz} + \beta_{xz}) + V_{oz})}{(He \times S \times \cos(\alpha_{xz}) + V_{ox})} \quad (5)$$

where $S_{xz}$ is a sensitivity difference between linear element X 310 and linear element Z 330, $\beta_{xz}$ is a non-orthogonality parameter associated with linear element X 310 and linear element Z 330 (e.g., a parameter that represents a real angular displacement between linear element X 310 and linear element Z 330, since an angle between linear element X 310 and linear element Z 330 may deviate from ninety degrees, for example, due to a mounting tolerance), and $V_{oz}$ is an offset voltage associated with linear element Z 330.

As another example, $\alpha_{yz}$ may be determined based on the following equation:

$$\alpha_{xz} = \arctan(V_z/V_x) = \arctan\frac{(He \times (S+S_{xz}) \times \sin(\alpha_{xz} + \beta_{xz}) + V_{oz})}{(He \times S \times \cos(\alpha_{xz}) + V_{ox})} \quad (6)$$

where $S_{yz}$ is a sensitivity difference between linear element Y 320 and linear element Z 330 and $\beta_{yz}$ is a non-orthogonality parameter associated with linear element Y 320 and linear element Z 330 (e.g., a parameter that represents a real angular displacement between linear element Y 320 and linear element Z 330, since an angle between linear element Y 320 and linear element Z 330 may deviate from ninety degrees, for example, due to a mounting tolerance).

In some implementations, $S_{xy}$, $S_{xz}$, $S_{yz}$, $V_{ox}$, $V_{oy}$, $V_{oz}$, $\beta_{xy}$, $\beta_{xz}$, and $\beta_{yz}$ may be eliminated (e.g., when known) such that equations (1), (2), and (3) to be equivalent to equations (4), (5), and (6), respectively:

$$\arctan(V_y/V_x) = \arctan(He_y/He_x) = \alpha_{xy} \quad (7)$$

$$\arctan(V_z/V_x) = \arctan(He_z/He_x) = \alpha_{xz} \quad (8)$$

$$\arctan(V_z/V_y) = \arctan(He_z/He_y) = \alpha_{yz} \quad (9)$$

As such, $\alpha_{xy}$, $\alpha_{xz}$, and/or $\alpha_{yz}$ may be determined based on output voltages $V_x$, $V_y$, and $V_z$, provided by linear element X 310, linear element Y 320, and linear element Z 330.

FIG. 6B is a diagram of an example of a manner in which $\alpha_{xy}$, $\alpha_{xz}$, and/or $\alpha_{yz}$ may be determined based on output voltages of linear element X 310, linear element Y 320, and linear element Z 330. As shown in FIG. 6B, linear element X 310 may sense He applied to angle sensor 220, and may provide output voltage $V_x$ to controller 230. Similarly, as shown, linear element Y 320 may sense $He_y$ applied to angle sensor 200, and may provide output voltage $V_y$ to controller

230. As further shown, linear element Z 330 may sense He$_z$ applied to angle sensor 220, and may provide output voltage V$_z$ to controller 230.

As shown, controller 230 may receive V$_x$, V$_y$, and V$_z$, and may calculate α$_{xy}$, α$_{xz}$, and/or α$_{yz}$ based on equations (7), (8), and (9), respectively. Here, a position (e.g., a linear position, a position on a two-dimensional plane, a position in a three-dimensional space, an angle of rotation, etc.) of magnet 210 in relation to angle sensor 220 may be determined based on the angles derived from the output voltages provided by the set of linear sensing elements. In some implementations, controller 230 may also determine an angular speed (e.g., a rotational speed) associated with magnet 210.

As indicated above, FIGS. 6A and 6B are provided merely as an example. Other examples are possible and may differ from what was described with regard to FIGS. 6A and 6B. For example, while FIGS. 6A and 6B are described using a particular set of equations, in some implementations, a different set of equations may be used to similarly determine the set of angles described above and/or a different set of angles based on the output voltages of the linear sensing elements.

Figure 7:
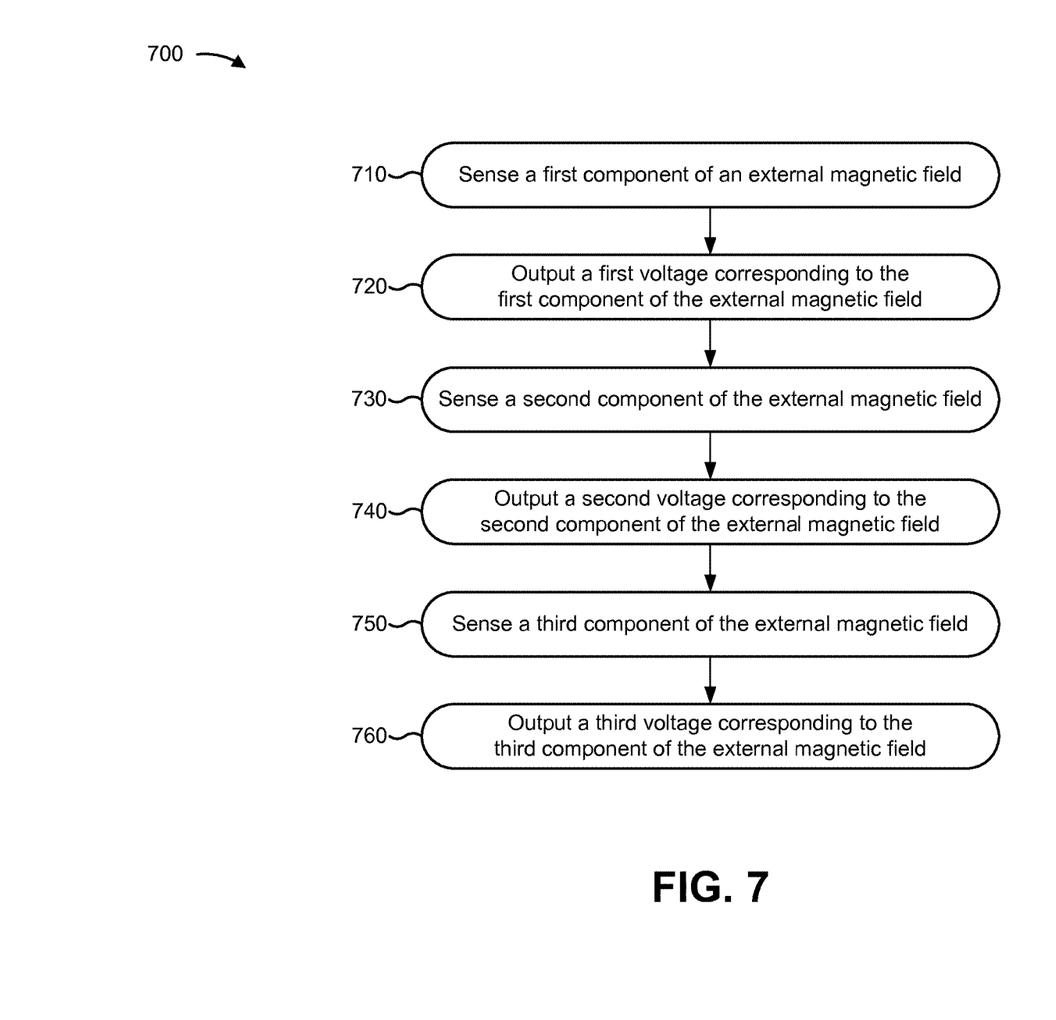
FIG. 7 is a flow chart of an example process for sensing components of an external magnetic field using linear sensing elements, and outputting voltages corresponding to the components of the external magnetic field for use in determining an angle associated with the external magnetic field.

FIG. 7 is a flow chart of an example process 700 for sensing components of an external magnetic field using linear sensing elements, and outputting voltages corresponding to the components of the external magnetic field for use in determining an angle associated with the external magnetic field. In some implementations, one or more process blocks of FIG. 7 may be performed by two or more linear output sensing elements of angle sensor 220.

As shown in FIG. 7, process 700 may include sensing a first component of an external magnetic field (block 710). For example, linear element X 310 may sense a first component of an external magnetic field, such as an X-component of the external magnetic field, as described above.

As further shown in FIG. 7, process 700 may include outputting a first voltage corresponding to the first component of the external magnetic field (block 720). For example, linear element X 310 may output a first voltage corresponding to the first component of the external magnetic field, as described above.

As further shown in FIG. 7, process 700 may include sensing a second component of the external magnetic field (block 730). For example, linear element Y 320 may sense a second component of the external magnetic field, such as a Y-component of the external magnetic field, as described above.

As further shown in FIG. 7, process 700 may include outputting a second voltage corresponding to the second component of the external magnetic field (block 740). For example, linear element Y 320 may output a second voltage corresponding to the second component of the external magnetic field, as described above.

As further shown in FIG. 7, process 700 may include sensing a third component of the external magnetic field (block 750). For example, linear element Z 330 may sense a third component of the external magnetic field, such as a Z-component of the external magnetic field, as described above.

As further shown in FIG. 7, process 700 may include outputting a third voltage corresponding to the third component of the external magnetic field (block 760). For example, linear element Z 330 may output a third voltage corresponding to the third component of the external magnetic field, as described above.

In some implementations, the first voltage, the second voltage, and/or the third voltage may be used to determine a position (e.g., one or more angles, a linear position, a position on two-dimensional plane, a position in a three-dimensional space) of magnet 210 that produces the external magnetic field, as described above.

Implementations described herein may facilitate determining one or more angles, associated with a magnetic field applied to an angle sensor, based on two or more output voltages provided by a set of linear sensing elements of the angle sensor. In some implementations, using the set of linear sensing elements may allow a magnetic field of any intensity to be sensed, such as a low intensity magnetic field or a high intensity magnetic field.

The foregoing disclosure provides illustration and description, but is not intended to be exhaustive or to limit the implementations to the precise form disclosed. Modifications and variations are possible in light of the above disclosure or may be acquired from practice of the implementations. For example, in some implementations, implementations described herein may be extended to a dual MR sensor associated with a functional safety application. For example, a first angle measurement may be performed based on sinusoidal outputs of an angle sensor using a traditional saturation approach. A second angle measurement may also be performed by angle sensor 220, as described herein. Here, a combination of the two angle measurement approaches (e.g., the saturation approach and the linear approach described herein) may provide sensor diversity for use in a safety application, such as an Automotive Safety Integrity Level (ASIL) functional safety application. In some implementations, the first angle sensor and angle sensor 220 may be implemented as a pair of integrated sensors, side by side integrated circuits, stacked integrated circuits, a pair of chips separated by a printed circuit board (PCB), or the like.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the terms "group" and "set" are intended to include one or more items (e.g., related items, unrelated items, a combination of related items and unrelated items, etc.), and may be used interchangeably with "one or more." Where only one item is intended, the term "one" or similar language is used. Also, as used herein, the terms "has", "have", "having", or the like are intended to be open-ended terms. Further, the phrase "based on" is intended to mean "based, at least in part, on" unless explicitly stated otherwise.

What is claimed is:

1. A magnetic sensor, comprising:
   a first linear output sensing element configured to:
   sense a first component of an external magnetic field, the first component of the external magnetic field being associated with a first axis, and
   provide a first output voltage corresponding to the first component of the external magnetic field; and a second linear output sensing element configured to:
  sense a second component of the external magnetic field,
    the second component of the external magnetic field being associated with a second axis,
      the second axis being substantially orthogonal to the first axis,
      the first output voltage being used as a supply voltage of the second linear output sensing element, and
  provide a second output voltage corresponding to the second component of the external magnetic field,
    the first output voltage and the second output voltage being provided to determine an angle associated with the external magnetic field,
      the angle corresponding to a plane including the first axis and the second axis.

2. The magnetic sensor of claim 1, further comprising:
a third linear output sensing element configured to:
  sense a third component of the external magnetic field,
    the third component of the external magnetic field being associated with a third axis,
      the third axis being substantially orthogonal to the first axis and substantially orthogonal the second axis; and
  provide a third output voltage corresponding to the third component of the external magnetic field,
    the third output voltage being provided to determine another angle associated with the external magnetic field,
      the other angle corresponding to a plane including the first axis and the third axis, or
      the other angle corresponding to a plane including the second axis and the third axis.

3. The magnetic sensor of claim 2, where the first output voltage, the second output voltage, and the third output voltage are provided to determine a position associated with the external magnetic field.

4. The magnetic sensor of claim 2, where the first linear output sensing element, the second linear output sensing element, and the third linear output sensing element are located on a single integrated circuit.

5. The magnetic sensor of claim 4, where the single integrated circuit has a length of approximately ten micrometers per side of the single integrated circuit.

6. The magnetic sensor of claim 2, where the first linear output sensing element, the second linear output sensing element, and the third linear output sensing element sense the respective first, second, and third components of the external magnetic field based on a tunnel magnetoresistance (TMR) effect, a giant magnetoresistance (GMR) effect, or an anisotropic magnetoresistance (AMR) effect.

7. The magnetic sensor of claim 1, where the angle is determined by dividing the second output voltage by the first output voltage to determine a value, and computing an inverse tangent of the value to determine the angle.

8. A method, comprising:
sensing, by a first linear output element, a first component of a magnetic field,
  the first component of the magnetic field being associated with a first direction;
outputting, by the first linear output element, a first voltage corresponding to the first component of the magnetic field;
sensing, by a second linear output element, a second component of the magnetic field,
  the second component of the magnetic field being associated with a second direction,
    the second direction being approximately ninety degrees with respect to the first direction;
  the first voltage being used as a supply voltage of the second linear output element; and
outputting, by the second linear output element, a second voltage corresponding to the second component of the magnetic field,
  the first voltage and the second voltage being provided to calculate a first angle associated with the magnetic field,
    the first angle being associated with a plane associated with the first direction and the second direction.

9. The method of claim 8, further comprising:
sensing, by a third linear output element, a third component of the magnetic field,
  the third component of the magnetic field being associated with a third direction,
    the third direction being approximately ninety degrees with respect to the
    first direction and approximately ninety degrees with respect to the second direction, and
outputting, by the third linear output element, a third voltage corresponding to the third component of the magnetic field,
  the third voltage being provided to calculate a second angle associated with the magnetic field,
    the second angle being associated with a plane associated with the first direction and the third direction, and
  the third voltage being provided to calculate a third angle associated with the magnetic field,
    the third angle being associated with a plane associated with the second direction and the third direction.

10. The method of claim 9, where the first angle is determined by dividing the second voltage by the first voltage to determine a first value, and computing an inverse tangent of the first value to determine the first angle,
  where the second angle is determined by dividing the third voltage by the first voltage to determine a second value, and computing an inverse tangent of the second value to determine the second angle, and
  where the third angle is determined by dividing the third voltage by the second voltage to determine a third value, and computing an inverse tangent of the third value to determine the third angle.

11. The method of claim 9, where the first voltage, the second voltage, and the third voltage are provided to determine a position associated with a magnet that produces the magnetic field.

12. The method of claim 8, where the first angle is greater than or equal to zero degrees and less than or equal to three hundred and sixty degrees.

13. The method of claim 9, where the first linear output element, the second linear output element, and the third linear output element sense the respective first, second, and third components of the magnetic field based on a tunnel magnetoresistance (TMR) effect, a giant magnetoresistance (GMR) effect, or an anisotropic magnetoresistance (AMR) effect.

14. The method of claim 8, where the first angle is used to measure an angular speed associated with the magnetic field.

15. An apparatus, comprising:
a first linear sensing element configured to:
  sense a first component of an external magnetic field,
    the first component of the external magnetic field corresponding to a first axis,
  provide a first voltage corresponding to the first component of the external magnetic field;
a second linear sensing element configured to:
  sense a second component of the external magnetic field,
    the second component of the external magnetic field corresponding to a second axis,
      the second axis being approximately orthogonal to the first axis,
      the first voltage being used as a supply voltage of the second linear sensing element, and
  provide a second voltage corresponding to the second component of the external magnetic field; and
a third linear sensing element configured to:
  sense a third component of the external magnetic field,
    the third component of the external magnetic field corresponding to a third axis,
      the third axis being approximately orthogonal to both the first axis and the second axis, and
  provide a third voltage corresponding to the third component of the external magnetic field,
    the first voltage, the second voltage, and the third voltage being provided to determine at least two angles or a position associated with the external magnetic field.

16. The apparatus of claim 15, where the at least two angles include at least two of:
  a first angle corresponding to a plane including the first axis and the second axis;
  a second angle corresponding to a plane including the first axis and the third axis; or
  a third angle corresponding to a plane including the second axis and the third axis.

17. The apparatus of claim 16, where the first angle is determined by dividing the second voltage by the first voltage to determine a first value, and computing an inverse tangent of the first value to determine the first angle,
  where the second angle is determined by dividing the third voltage by the first voltage to determine a second value, and computing an inverse tangent of the second value to determine the second angle, and
  where the third angle is determined by dividing the third voltage by the second voltage to determine a third value, and computing an inverse tangent of the third value to determine the third angle.

18. The apparatus of claim 15, where the first linear sensing element, the second linear sensing element, and the third linear sensing element are located on a single integrated circuit.

19. The apparatus of claim 15, where the first linear sensing element, the second linear sensing element, and the third linear sensing element sense the respective first, second, and third components of the external magnetic field based on a tunnel magnetoresistance (TMR) effect, a giant magnetoresistance (GMR) effect, or an anisotropic magnetoresistance (AMR) effect.

20. The apparatus of claim 15, where the first voltage, the second voltage, and the third voltage are provided to determine a position associated with a magnet that generates the external magnetic field.

\* \* \* \* \*